United States Patent
Pellizzer et al.

(10) Patent No.: US 10,424,618 B2
(45) Date of Patent: Sep. 24, 2019

(54) ARRAY OF CROSS POINT MEMORY CELLS AND METHODS OF FORMING AN ARRAY OF CROSS POINT MEMORY CELLS

(71) Applicant: Micron Technology, Inc., Boise, ID (US)

(72) Inventors: Fabio Pellizzer, Boise, ID (US); Stephen W. Russell, Boise, ID (US); Tony M. Lindenberg, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 15/851,112

(22) Filed: Dec. 21, 2017

(65) Prior Publication Data

US 2018/0138239 A1 May 17, 2018

Related U.S. Application Data

(60) Continuation of application No. 15/155,433, filed on May 16, 2016, now Pat. No. 9,899,451, which is a division of application No. 14/293,577, filed on Jun. 2, 2014, now Pat. No. 9,362,494.

(51) Int. Cl.
*H01L 27/24* (2006.01)
*H01L 45/00* (2006.01)

(52) U.S. Cl.
CPC ...... *H01L 27/2472* (2013.01); *H01L 27/2427* (2013.01); *H01L 27/2463* (2013.01); *H01L 45/04* (2013.01); *H01L 45/06* (2013.01); *H01L 45/065* (2013.01); *H01L 45/126* (2013.01); *H01L 45/1233* (2013.01); *H01L 45/144* (2013.01); *H01L 45/146* (2013.01); *H01L 45/147* (2013.01); *H01L 45/1675* (2013.01)

(58) Field of Classification Search
None
See application file for complete search history.

(56) References Cited

U.S. PATENT DOCUMENTS

| | | |
|---|---|---|
| 6,579,760 B1 | 6/2003 | Lung |
| 2005/0001212 A1 | 1/2005 | Matsui |
| 2005/0243596 A1 | 11/2005 | Symanczyk |
| 2010/0171188 A1 | 7/2010 | Lung et al. |

*Primary Examiner* — Bo B Jang
(74) *Attorney, Agent, or Firm* — Wells St. John P.S.

(57) ABSTRACT

An array of cross point memory cells comprises spaced elevationally inner first lines, spaced elevationally outer second lines which cross the first lines, and a multi-resistive state region elevationally between the first and second lines where such cross. Individual of the multi-resistive state regions comprise elevationally outer multi-resistive state material and elevationally inner multi-resistive state material that are electrically coupled to one another. The inner multi-resistive state material has opposing edges in a vertical cross-section. The outer multi-resistive state material has opposing edges in the vertical cross-section that are laterally offset relative to the opposing edges of the inner multi-resistive state material in the vertical cross-section. Methods are also disclosed.

20 Claims, 15 Drawing Sheets

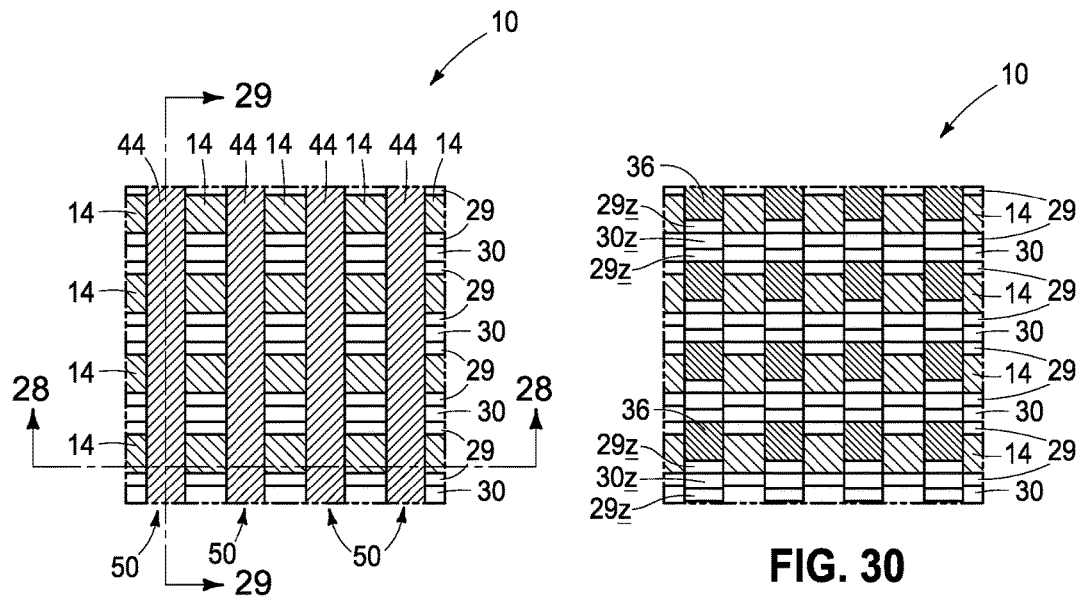
FIG. 27
FIG. 30
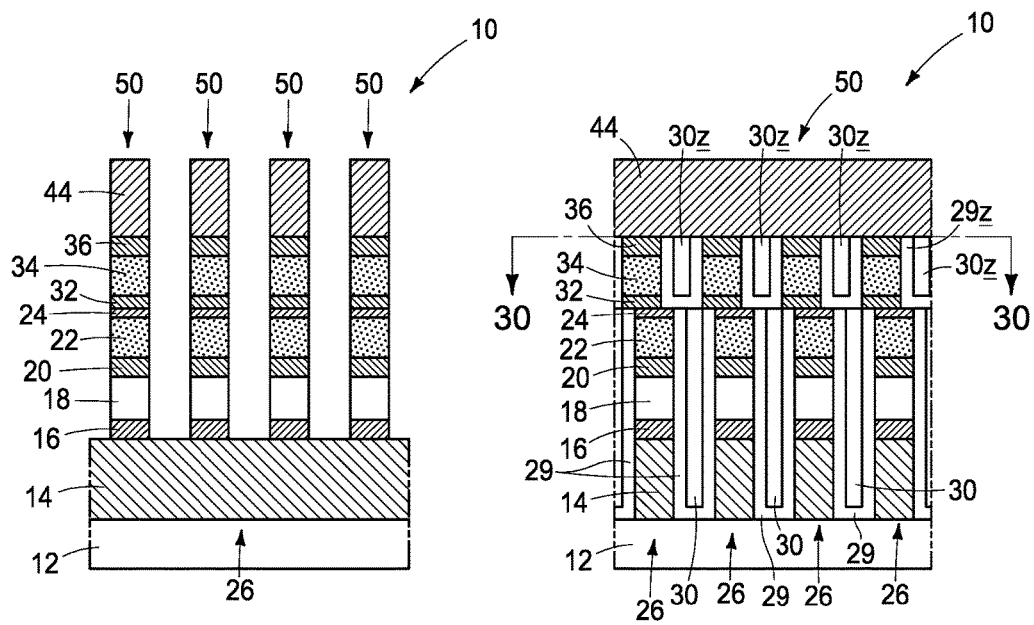
FIG. 28
FIG. 29

ARRAY OF CROSS POINT MEMORY CELLS AND METHODS OF FORMING AN ARRAY OF CROSS POINT MEMORY CELLS

RELATED PATENT DATA

This patent resulted from a continuing application of U.S. patent application Ser. No. 15/155,433, filed May 16, 2016, entitled "Array Of Cross Point Memory Cells And Methods Of Forming An Array Of Cross Point Memory Cells", naming Fabio Pellizer, Stephen W. Russell, and Tony M. Lindenberg as inventors, which was a divisional application of U.S. patent application Ser. No. 14/293,577, filed Jun. 2, 2014, entitled "Array Of Cross Point Memory Cells And Methods Of Forming An Array Of Cross Point Memory Cells", naming Fabio Pellizer, Stephen W. Russell, and Tony M. Lindenberg as inventors, the disclosures of which are incorporated by reference.

TECHNICAL FIELD

Embodiments disclosed herein pertain to arrays of cross point memory cells and to methods of forming arrays of cross point memory cells.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information. The memory cells might be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds, or less.

Integrated circuitry fabrication continues to strive to produce smaller and denser integrated circuits. There is a continuing effort to reduce the number of components in individual devices because such can reduce the size of finished constructions and simplify processing. The smallest and simplest memory cell will likely be comprised of two electrodes having a programmable material, and possibly a select device (such as a diode or ovonic threshold switch), received between them. Suitable programmable materials have two or more selectable memory states to enable storing of information by an individual memory cell. The reading of the cell comprises determination of which of the states the programmable material is in, and the writing of information to the cell comprises placing the programmable material in a predetermined state. Some programmable materials retain a memory state in the absence of refresh, and thus may be incorporated into nonvolatile memory cells.

One type of non-volatile memory is phase change memory. Such memory uses a reversibly programmable material that has the property of switching between two different phases, for example between an amorphous, disorderly phase and a crystalline or polycrystalline, orderly phase. The two phases may be associated with resistivities of significantly different values. Presently, typical phase change materials are chalcogenides, although other materials may be developed. With chalcogenides, the resistivity may vary by two or more orders of magnitude when the material passes between the amorphous (more resistive) phase and the crystalline (more conductive) phase. Phase change can be obtained by locally increasing the temperature of the chalcogenide. Below 150° C., both phases are stable. Starting from an amorphous state and rising to temperature above about 400° C., a rapid nucleation of the crystallites may occur and, if the material is kept at the crystallization temperature for a sufficiently long time, it undergoes a phase change to become crystalline. Reversion to the amorphous state can result by raising the temperature above the melting temperature (about 600° C.) followed by cooling.

In phase change memory, a plurality of memory cells is typically arranged in rows and columns to form an array or sub-array. Each memory cell is coupled to a respective select or access device which may be implemented by any switchable device, such as a PN diode, a bipolar junction transistor, a field effect transistor, etc. The access device is often electrically coupled with, or forms a part of, what is referred to as an access line or word line. A resistive electrode is electrically coupled with the switchable device, and comprises heater material which is configured to heat up upon sufficient current flowing there-through. The phase change material is provided in proximity to the heater material, thereby forming a programmable storage element. The crystallization temperature and the melting temperature are obtained by causing an electric current to flow through the heater material, thus heating the phase change material. Alternately, the access device may be essentially sufficiently self-heating upon current flow there-through whereby separate heater material is not used. Regardless, an electrode, typically referred to as a bit, digit, or select line, is electrically coupled to the phase change material.

Multi-resistive state materials, such as phase change materials, can pose challenges during manufacture. For example in cross point memory, individual memory cells may encompass a multi-resistive state material between a top electrode and a middle electrode. A select device may be between the middle electrode and a bottom electrode. All of these features may be received elevationally between a bottom electrode line and a crossing top electrode line. Materials of all this components should be able to withstand all of the processing during fabrication of each material into a desired finished shape. Unfortunately, many phase change materials exhibit mechanical weakness particularly as their thicknesses increase.

BRIEF DESCRIPTION OF THE DRAWINGS

FIG. 27 is a view of the FIG. 24 substrate at a processing step subsequent to that shown by FIG. 24.

FIG. 28 is a diagrammatic sectional view taken through line 28-28 in FIG. 27.

FIG. 29 is a diagrammatic sectional view taken through line 29-29 in FIG. 27.

FIG. 30 is a diagrammatic sectional view taken through line 30-30 in FIG. 29, and is rotated 90° to conform to the substrate positioning as shown in FIG. 27.

DETAILED DESCRIPTION OF EXAMPLE EMBODIMENTS

Figure 1:
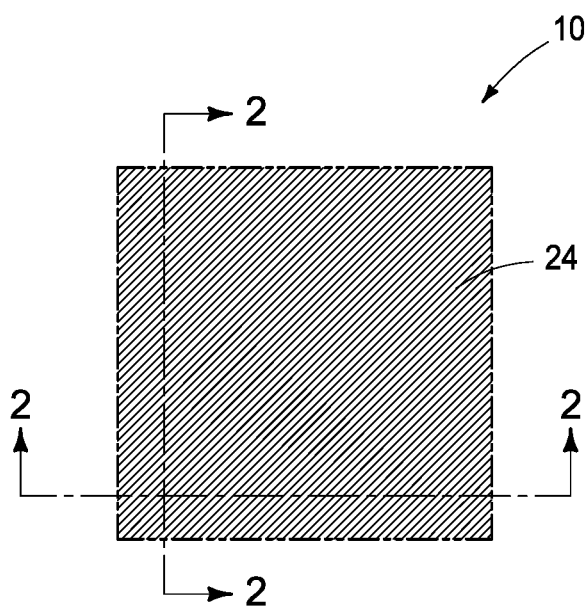
FIG. 1 is a diagrammatic top plan view of a substrate fragment in process in accordance with an embodiment of the invention.
Figure 2:
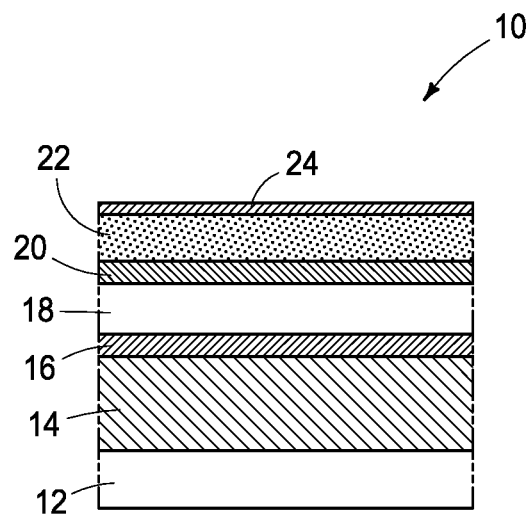
FIG. 2 is a diagrammatic sectional view taken through either of lines 2-2 in FIG. 1.

Example methods of forming an array of cross point memory cells are initially described with referring to FIGS. 1-34. FIGS. 1 and 2 show a substrate fragment 10 comprising a base substrate 12 having various materials formed thereover. Substrate 12 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Partially or wholly fabricated components of integrated circuitry may be formed as part of, or be elevationally inward of, substrate material 12.

Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Inner conductive (i.e., electrically) electrode material 14 has been formed over base substrate 12. Example compositions for electrode material 14 are elemental metals, a mixture or alloy of two or more elemental metals, conductive metal compounds, and conductively-doped semiconductive materials. An example thickness for material 14 is about 20 to 100 nm. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness.

Conductive bottom electrode material 16 has been formed over inner electrode material 14, and in one embodiment directly against material 14. In this document, "elevational", "upper", "lower", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another independent of orientation of the substrate in three-dimensional space. An example thickness for bottom electrode material 16 is about 10 to 50 nm. Example compositions are as described above for material 14.

Select device material 18 has been formed over bottom electrode material 16, and in one embodiment directly against material 16. Such may be formed of any suitable material(s) to provide a select device function (e.g., as a diode or ovonic threshold switch). An example thickness for select device material 18 is about 10 to 40 nm. Conductive mid-electrode material 20 has been formed over select device material 18, and in one embodiment directly against material 18. Example compositions for mid-electrode material 20 are as described above for material 16. Additionally or alternately, material 16 may comprise heater material particularly when multi-resistive state material described below comprises phase change material and where programming occurs by heating. Example heater materials are TiSiN-based materials and TiN-based materials having material other than silicon therein. An example thickness for mid-electrode material 20 is about 5 to 50 nm. Bottom electrode material 16 and/or mid-electrode material 20 may have diffusion barrier properties. Bottom electrode material 16 may also comprise heater material.

Inner multi-resistive state material 22 is formed elevationally over mid-electrode material 20, and in one embodiment directly against material 20. In one embodiment, such comprises phase change material, with example compositions being chalcogenides such as GeSbTe-based materials. Other multi-resistive state materials may be used, such as multi-resistive state metal oxide-comprising materials, for example comprising two different layers or regions generally regarded as or understood to be active or passive regions, although not necessarily. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, an example thickness for inner multi-resistive state material 22 is about 10 to 30 nm.

Material 24 is formed elevationally over inner multi-resistive state material 22, and in one embodiment directly against material 22. In one embodiment, material 24 is at least one of metal material and semi-metal material. In this document, a "metal material" contains metal in any of elemental, alloy, and compound forms and has an electrical resistance of less than $1 \times 10^{-4}$ ohm·cm. Examples are elemental metals, a mixture or alloy of two or more elemental metals, and conductive metal compounds, such as tungsten, tungsten nitride, titanium, and titanium nitride. In this document, a "semi-metal material" is any composition having an electrical resistance of from $1 \times 10^{-4}$ ohm·cm to $1 \times 10^{-2}$ ohm·cm. Examples include titanium-silicon-nitride (e.g., heater material), conductively doped semiconductive materials, and tungsten carbide. In one embodiment, material 24 is not programmable material (i.e., it is intrinsically not capable of being programmed to different resistive states). An example thickness for material 24 is about 2 to 20 nm.

Figure 3:
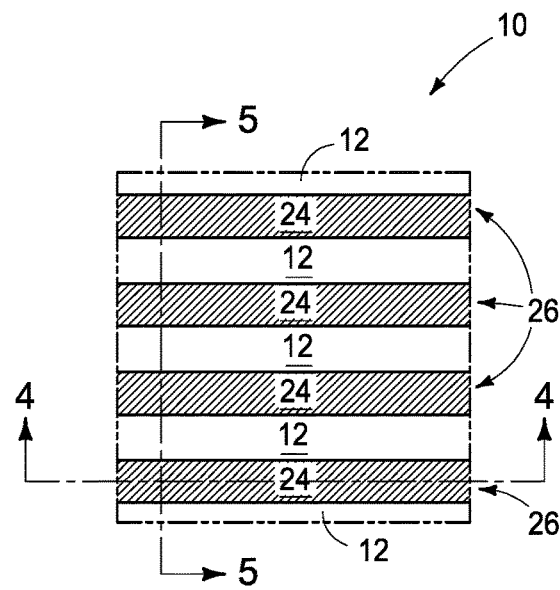
FIG. 3 is a view of the FIG. 1 substrate at a processing step subsequent to that shown by FIG. 1.
Figure 4:
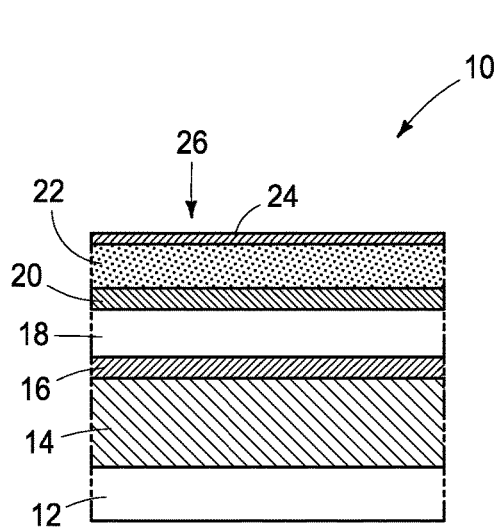
FIG. 4 is a diagrammatic sectional view taken through line 4-4 in FIG. 3.
Figure 5:
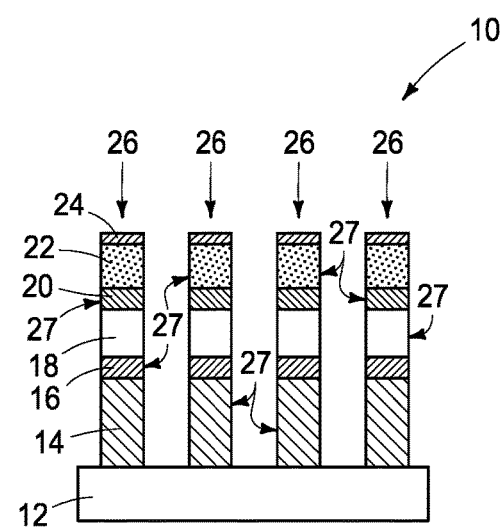
FIG. 5 is a diagrammatic sectional view taken through line 5-5 in FIG. 3.

Referring to FIGS. 3-5, materials 14-24 have been patterned to form spaced first lines 26. An example technique includes photolithographic patterning and etch. Regardless, pitch multiplication may be used. First lines 26 may be considered as having longitudinal edges 27.

Figure 6:
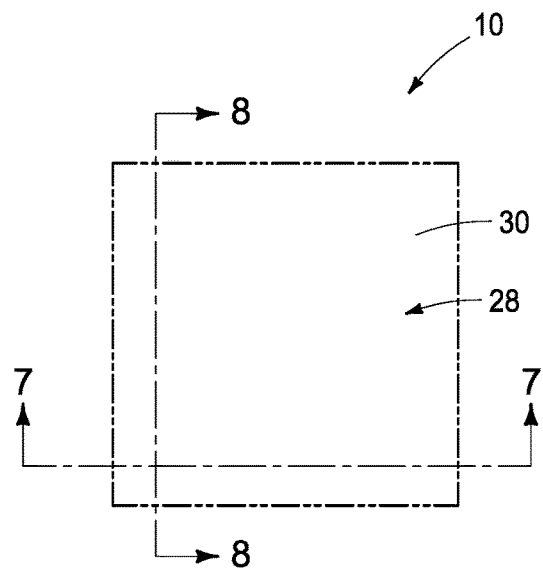
FIG. 6 is a view of the FIG. 3 substrate at a processing step subsequent to that shown by FIG. 3.
Figure 7:
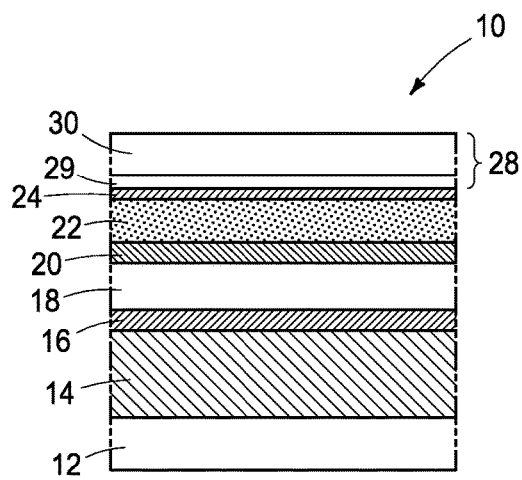
FIG. 7 is a diagrammatic sectional view taken through line 7-7 in FIG. 6.
Figure 8:
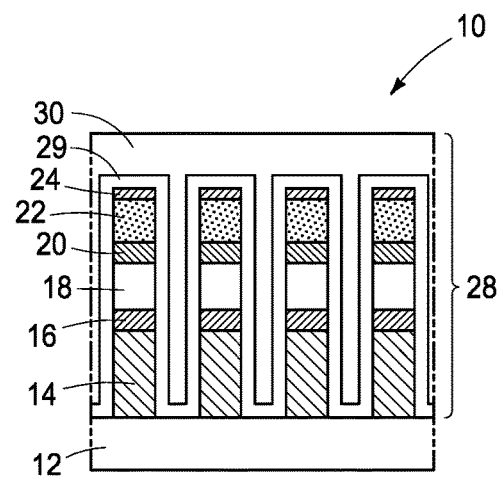
FIG. 8 is a diagrammatic sectional view taken through line 8-8 in FIG. 6.

Referring to FIGS. 6-8, dielectric material 28 has been deposited to cover over material 24, in one embodiment directly against material 24, and to overfill spaces between first lines 26. In one embodiment and as shown, dielectric material 28 comprises a first dielectric material 29 (e.g., silicon nitride) and a second dielectric material 30 (e.g., doped or undoped silicon dioxide). Two different composition dielectric materials 29, 30 may be used where a more desired dielectric material 30 would otherwise react or negatively interact with one of more of materials 14-24.

Figure 9:
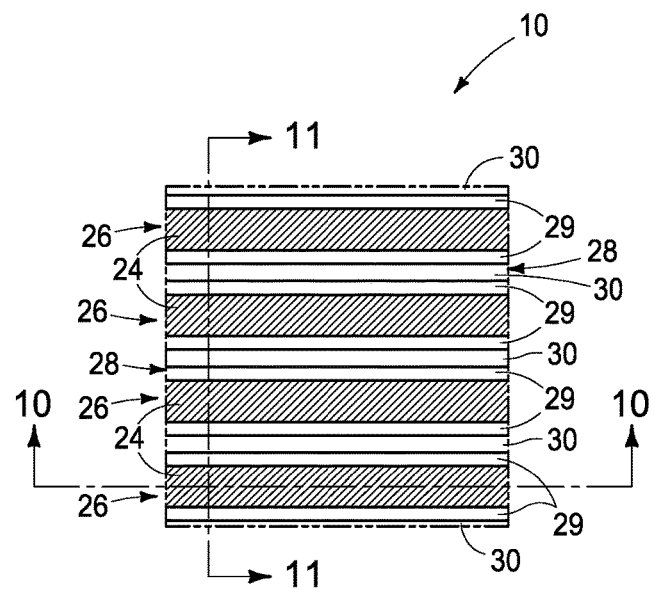
FIG. 9 is a view of the FIG. 6 substrate at a processing step subsequent to that shown by FIG. 6.
Figure 10:
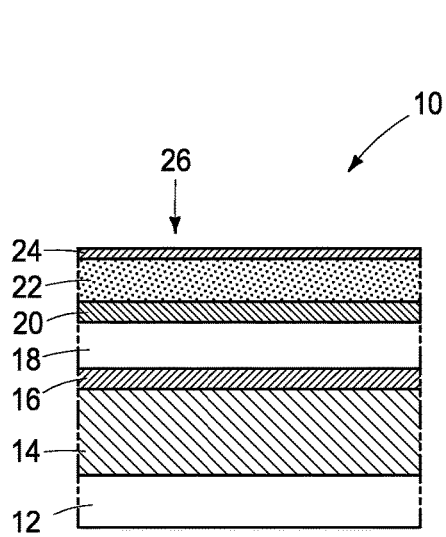
FIG. 10 is a diagrammatic sectional view taken through line 10-10 in FIG. 9.
Figure 11:
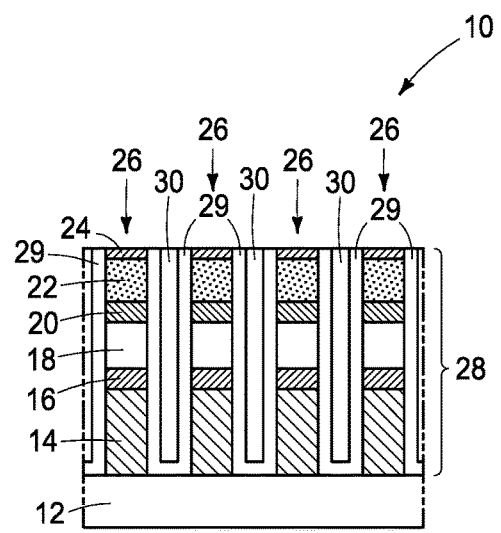
FIG. 11 is a diagrammatic sectional view taken through line 11-11 in FIG. 9.

Referring to FIGS. 9-11, dielectric material 28 has been polished back to expose material 24, and in one embodiment using material 24 as a polish stop. Example polishing techniques include mechanical polishing and chemical mechanical polishing.

Figure 12:
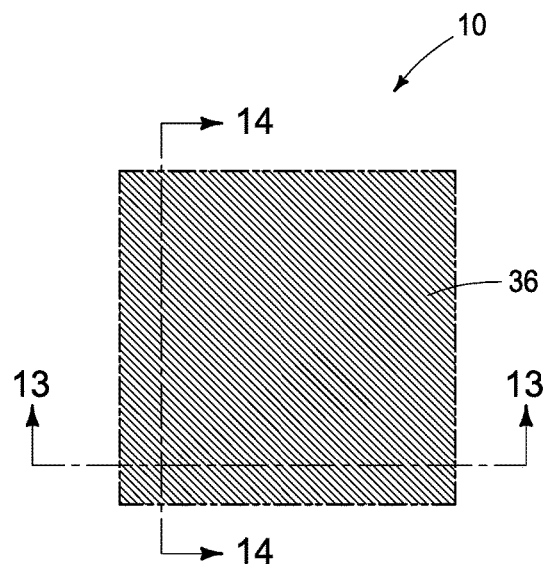
FIG. 12 is a view of the FIG. 9 substrate at a processing step subsequent to that shown by FIG. 9.
Figure 13:
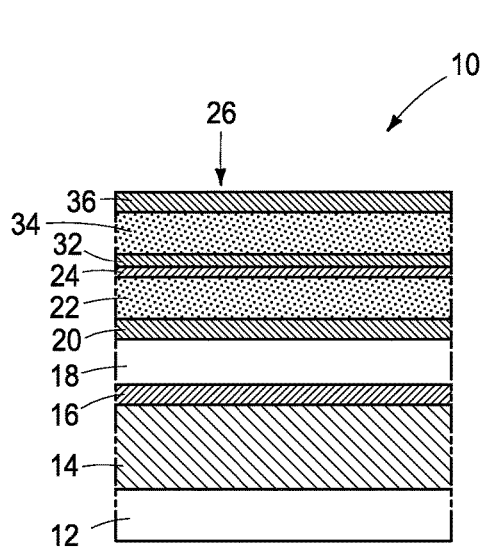
FIG. 13 is a diagrammatic sectional view taken through line 13-13 in FIG. 12.
Figure 14:
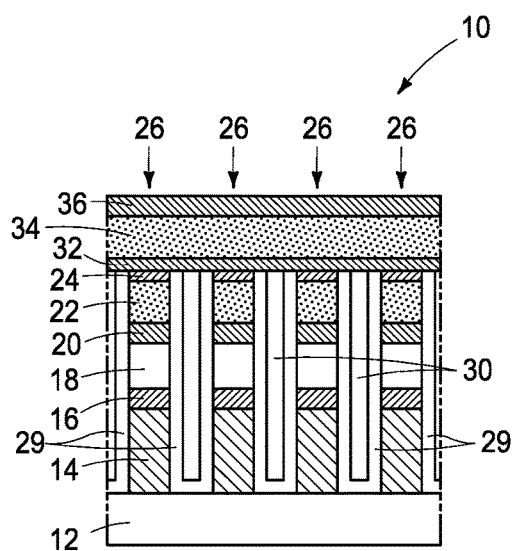
FIG. 14 is a diagrammatic sectional view taken through line 14-14 in FIG. 12.

Referring to FIGS. 12-14, and in one embodiment, material 24 may be considered as lower material that is formed prior to forming first lines 26. Upper material 32 is formed over, and in one embodiment directly against, lower material 24. Upper material 32 comprises at least one of metal material and semi-metal material. Examples include those materials described above for material 24. Lower material 24 and upper material 32 may be of the same composition or of different compositions relative one another. An example thickness for upper material 32 is about 2 to 20 nm.

Outer multi-resistive state material 34 is formed elevationally over upper material 32, and in one embodiment directly against material 32. Example outer multi-resistive state materials are the same as those described above for inner multi-resistive state material 22. Materials 22 and 34 may be of the same composition or of different compositions relative one another, and/or of same or different thickness relative one another. An example thickness for outer multi-resistive state material 34 is about 10 to 30 nm. In the depicted embodiment, outer multi-resistive state material 34 electrically couples to inner multi-resistive state material 22 through materials 32 and 24 (e.g., a contact resistance between materials 34 and 22 of no greater than about $10^{-7}$ ohm·cm$^2$ when materials 34 and 22 are programmed to be in a respective highest conductivity state). In one embodiment, one or both of materials 32 and 24 are formed to be intrinsically of higher conductivity (i.e., electrical) than each of inner multi-resistive state material 22 and outer multi-resistive state material 34 when materials 22 and 34 are programmed to be in a respective highest conductivity state. FIGS. 12-14 depict an example embodiment wherein outer multi-resistive state material 34 is not formed directly against inner multi-resistive state material 22 within the array. Alternate embodiments are described below, and which may or may not include use of one or both of materials 24 and 32.

Conductive top electrode material 36 is formed over outer multi-resistive state material 34, and in one embodiment directly against material 34. Example materials include any of those described above for material 16. An example thickness for material 36 is about 10 to 50 nm. Top electrode material 36, upper material 32, and/or lower material 24 may have diffusion barrier properties.

Figure 15:
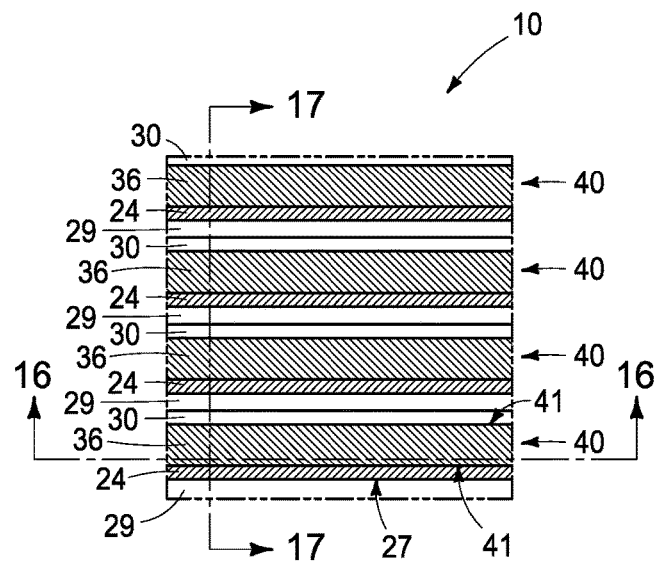
FIG. 15 is a view of the FIG. 12 substrate at a processing step subsequent to that shown by FIG. 12.
Figure 16:
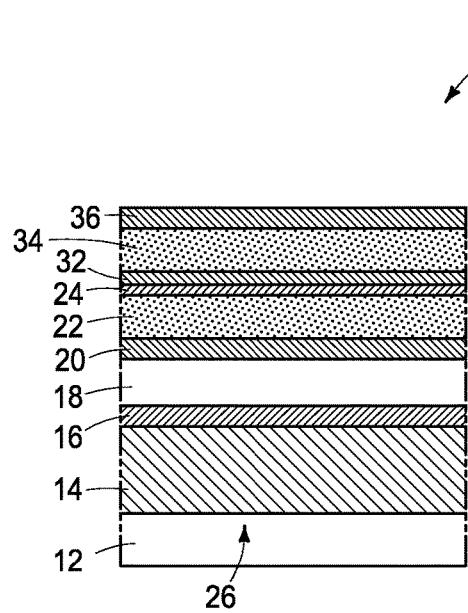
FIG. 16 is a diagrammatic sectional view taken through line 16-16 in FIG. 15.
Figure 17:
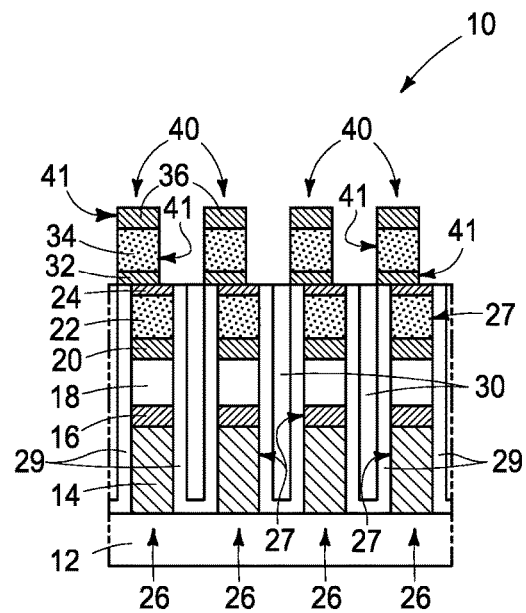
FIG. 17 is a diagrammatic sectional view taken through line 17-17 in FIG. 15.

Referring to FIGS. 15-17, materials 32, 34, and 36 have been patterned to form spaced second lines 40 that individually are elevationally over, longitudinally along, and electrically coupled to inner multi-resistive state material 22 of first lines 26. In one embodiment, second lines 40 are formed to have longitudinal edges 41 that are laterally offset from longitudinal edges 27 of first lines 26. Such may result as an artifact of manufacture where, for example, a mask pattern for second lines 40 is the same as a mask pattern for first lines 26 and mis-alignment occurs of those masks relative to one another. Alternately, a lateral offset may be intentional. Regardless, such will result in less contact area between multi-resistive state materials 22, 34 than would occur if perfect alignment was achieved of the mask for forming second lines 40 relative to that for forming first lines 26. Forming at least upper material 32 to be of higher conductivity than material 34 when in its highest conductivity state may facilitate reduction of contact resistance between materials 22 and 34.

Figure 18:
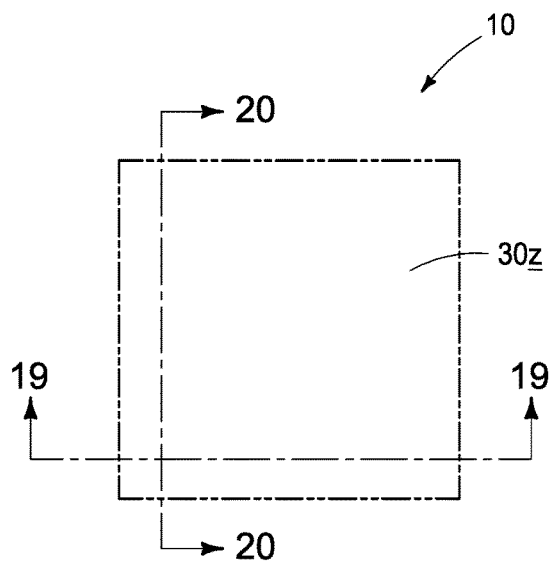
FIG. 18 is a view of the FIG. 15 substrate at a processing step subsequent to that shown by FIG. 15.
Figure 19:
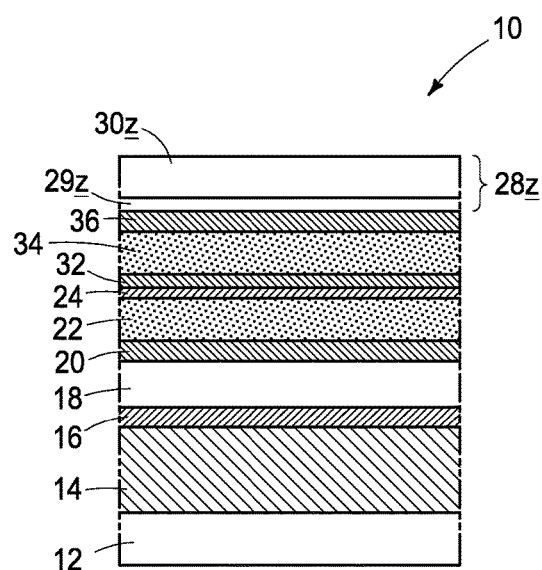
FIG. 19 is a diagrammatic sectional view taken through line 19-19 in FIG. 18.
Figure 20:
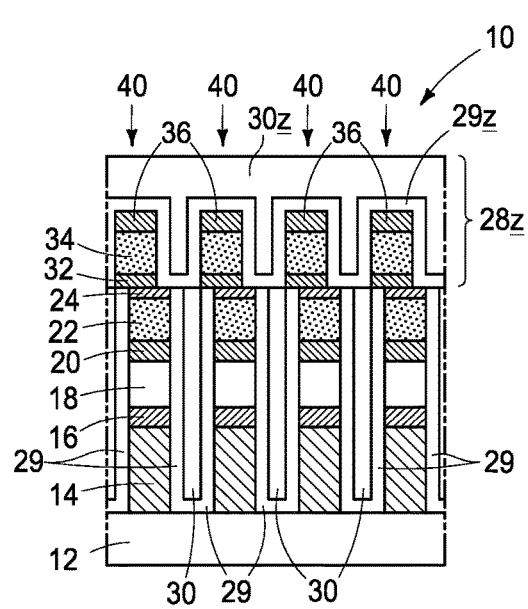
FIG. 20 is a diagrammatic sectional view taken through line 20-20 in FIG. 18.

Referring to FIGS. 18-20, dielectric material 28z has been deposited to cover over top electrode material 36 and overfill spaces between second lines 40. Material 28z may comprise first and second dielectric material 29z and 30z, respectively, with example compositions being those as described above for dielectric materials 29 and 30, respectively.

Figure 21:
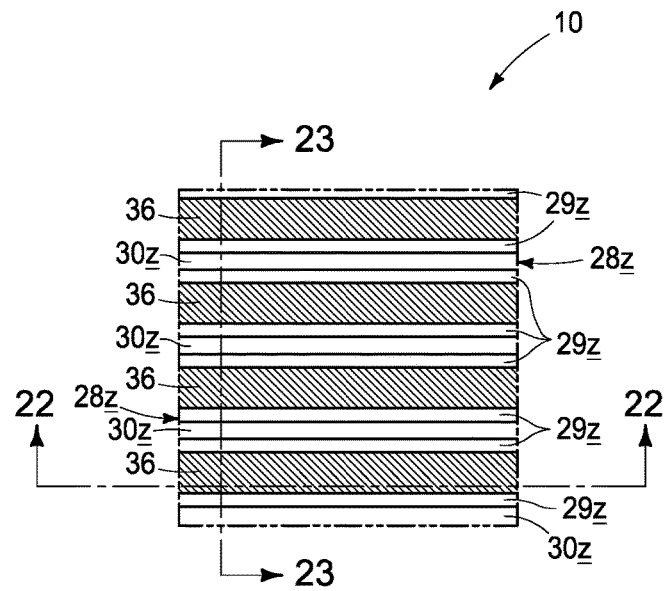
FIG. 21 is a view of the FIG. 18 substrate at a processing step subsequent to that shown by FIG. 18.
Figure 22:
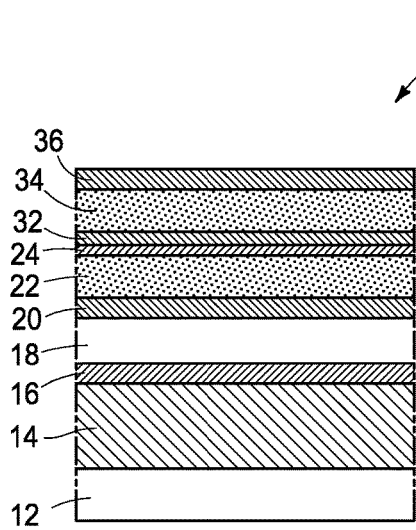
FIG. 22 is a diagrammatic sectional view taken through line 22-22 in FIG. 21.
Figure 23:
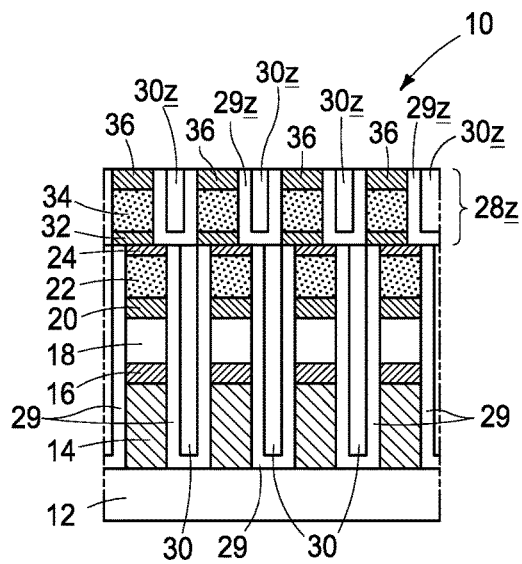
FIG. 23 is a diagrammatic sectional view taken through line 23-23 in FIG. 21.

Referring to FIGS. 21-23, dielectric material 28z has been polished back to expose top electrode material 36.

Figure 24:
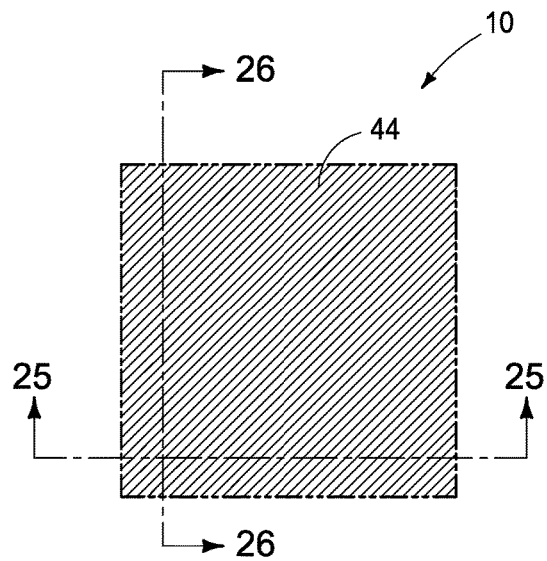
FIG. 24 is a view of the FIG. 21 substrate at a processing step subsequent to that shown by FIG. 21.
Figure 25:
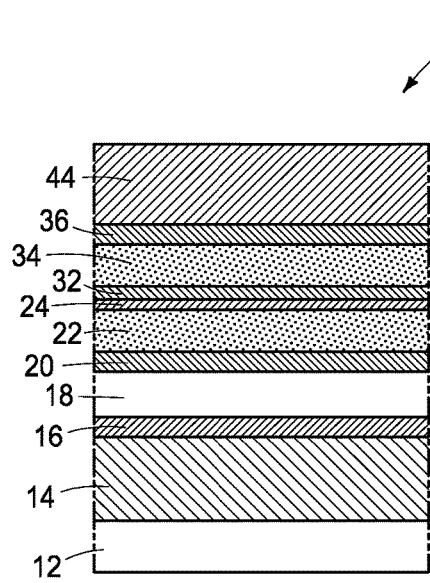
FIG. 25 is a diagrammatic sectional view taken through line 25-25 in FIG. 24.
Figure 26:
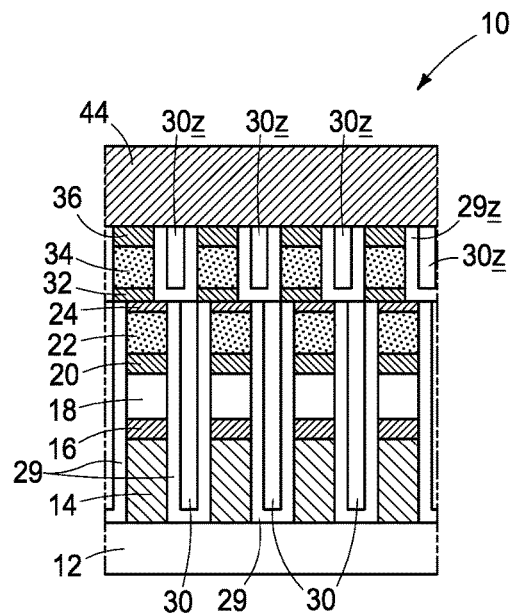
FIG. 26 is a diagrammatic sectional view taken through line 26-26 in FIG. 24.

Referring to FIGS. 24-26, outer conductive material 44 has been formed elevationally over top electrode material 36, and in one embodiment directly against material 36. Outer conductive material 44 in the depicted embodiment electrically couples to patterned outer multi-resistive state material 34 through top electrode material 36. Example compositions and thickness for outer conductive material are the same as those described above for inner electrode material 14.

Referring to FIGS. 27-30, materials 16, 18, 20, 22, 24, 32, 34, 36, 44, 29, 30, 29z, and 30z have been patterned to form spaced third lines 50 which comprise outer conductive material 44 crossing elevationally over and electrically coupled to previously-patterned (e.g., partially patterned) outer multi-resistive state material 34. Example techniques for forming lines 50 include photolithographic patterning and etch. Regardless, pitch multiplication may be used. In one embodiment, the forming of third lines 50 within the array comprises etching using a mask (the mask not being shown). The etching using the mask in such embodiment may comprise etching top electrode material 36, inner and outer multi-resistive state materials 34, 22, and bottom electrode material 16 (i.e., at least these materials) inwardly to inner conductive electrode material 14.

Lines 50 comprise continuously-running outer conductive material 44 and remaining lines 26 comprise continuously-running inner conductive material 14. Lines 26 may be considered and/or function as access row lines. Lines 50 may be considered and/or function as sense column lines. However, use of "row" and "column" in this document is for convenience in distinguishing one series of lines from another series of lines. Accordingly, "row" and "column" are intended to be synonymous with any series of lines independent of function. Regardless, the rows may be straight and/or curved and/or parallel and/or not parallel relative one another, as may be the columns. Further, the rows and columns may intersect relative one another at 90° or at one or more other angles. In the depicted example, each of the row lines and column lines are shown as being individually straight and angling relative one another at 90°.

Figure 31:
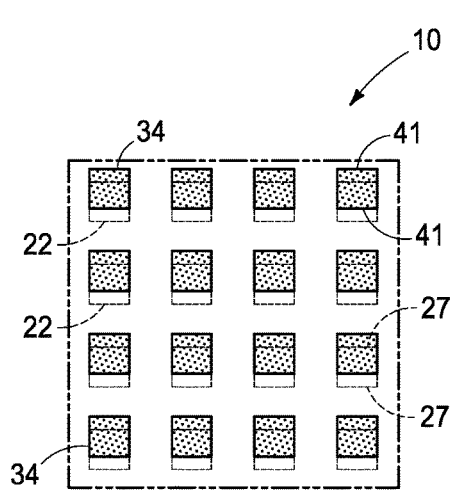
FIG. 31 is a diagrammatic sectional view of the FIG. 28 substrate.

FIG. 31 is a diagrammatic depiction showing and comparing horizontal shape and position of outer multi-resistive state material 34 and inner multi-resistive state material 22 relative one another. All other material is not shown for clarity. Materials 36 and 32 may be of the same horizontal shape and position as outer multi-resistive state material 34. Materials 24, 20, 18 and 16 may be of the same horizontal shape and position as inner multi-resistive state material 22.

Figure 32:
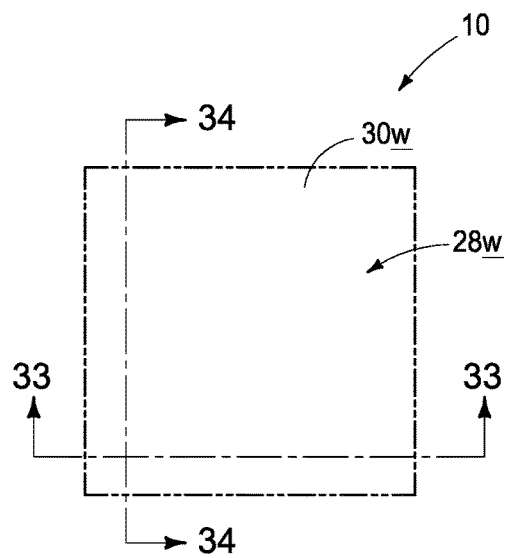
FIG. 32 is a view of the FIG. 28 substrate at a processing step subsequent to that shown by FIG. 28.
Figure 33:
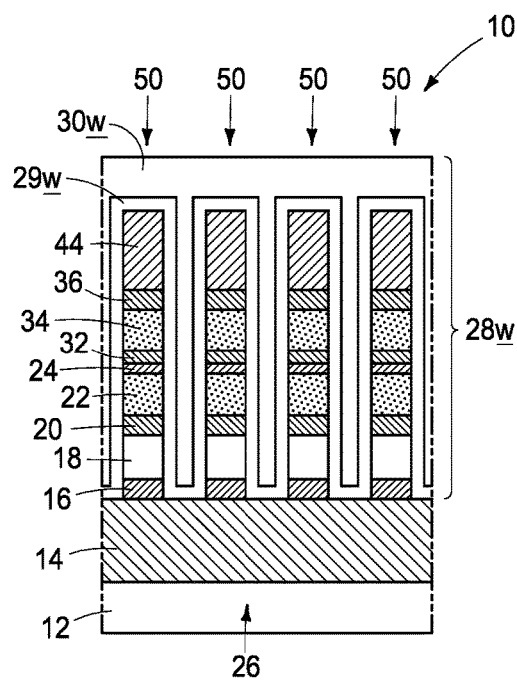
FIG. 33 is a diagrammatic sectional view taken through line 33-33 in FIG. 32.
Figure 34:
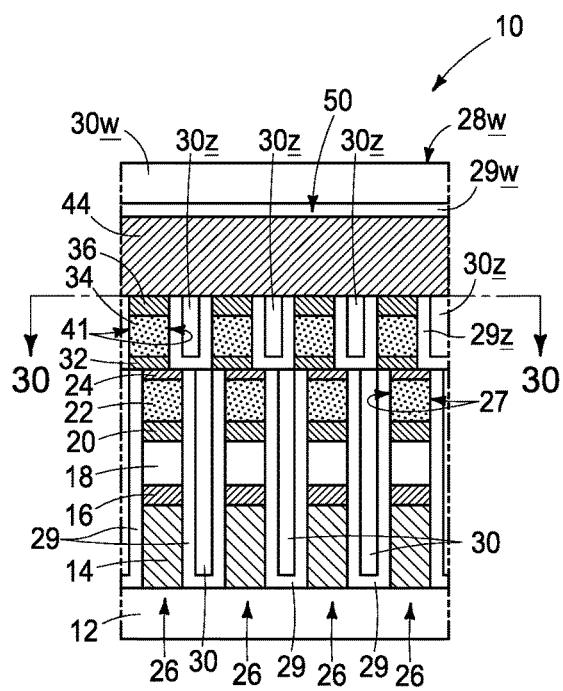
FIG. 34 is a diagrammatic sectional view taken through line 34-34 in FIG. 32.

Referring to FIGS. 32-34, dielectric material 28w has been deposited to overlie third lines 50 and fill void space between third lines 50 and patterned materials 44, 36, 34, 32, 24, 22, 20, 18, and 16. Material 28w may comprise first and second dielectric material 29w and 30w, respectively, with example compositions being those as described above for dielectric materials 29 and 30, respectively.

Some embodiments of the invention include a method of forming an array of cross point memory cells comprising patterning inner multi-resistive state material (e.g., material 22) and inner electrode material (e.g., material 14) to form spaced first lines (e.g., lines 26) individually comprising the inner multi-resistive state material elevationally over the electrode material independent of whether other material is present (e.g., regardless of presence of one or more of materials 24, 20, 18, and 16). Elevationally outer multi-resistive state material (e.g., material 34) is formed elevationally over and electrically coupled to inner multi-resistive state material (e.g., material 22) of the first lines independent of whether other material is present (e.g., regardless of presence of one or more of materials 24, 32, 28, 29 and 30). The outer multi-resistive state material is patterned to form spaced second lines (e.g., lines 40) that individually are elevationally over, longitudinally along, and electrically coupled to the inner multi-resistive state material of individual of the first lines. Spaced third lines (e.g., lines 50) are formed which comprise outer conductive electrode material (e.g., material 44) crossing elevationally over and electrically coupled to the previously-patterned outer multi-resistive state material independent of whether other material is present (e.g., regardless of presence of one or more of materials 36, 28, 29, 30, 28z, 29z, and 30z).

Embodiments of the invention encompass using both of lower material 24 and upper material 32, using neither of lower material 24 and upper material 32, using only lower material 24 and not using upper material 32, and using only upper material 32 and not using lower material 24. When both materials are used and polishing is used before forming the outer multi-resistive state material, composition of lower material 24 may be optimized for use as a polish stop and composition of upper material 32 may be optimized for conductivity (e.g., independent of whether lower material is in the finished circuitry construction).

Figure 35:
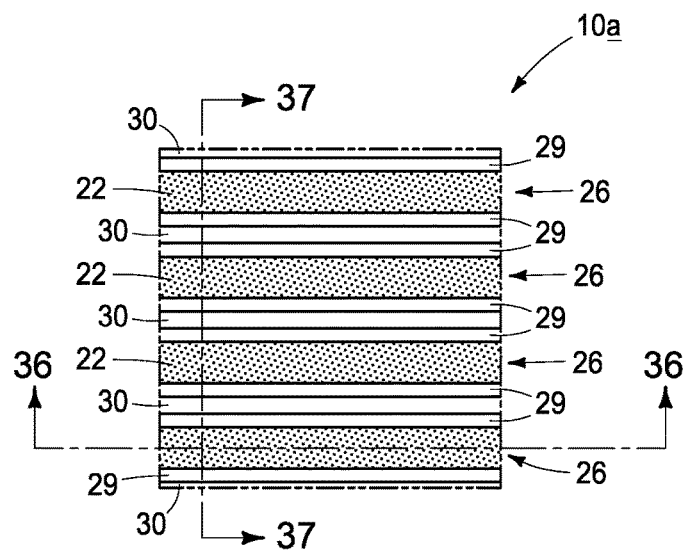
FIG. 35 is a diagrammatic top plan view of a substrate fragment in process in accordance with an embodiment of the invention.
Figure 36:
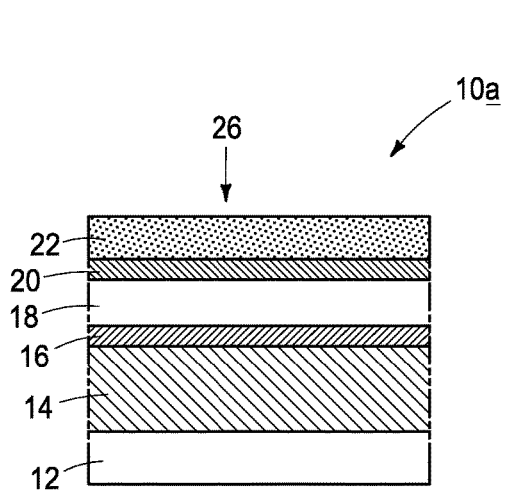
FIG. 36 is a diagrammatic sectional view taken through line 36-36 in FIG. 35.
Figure 37:
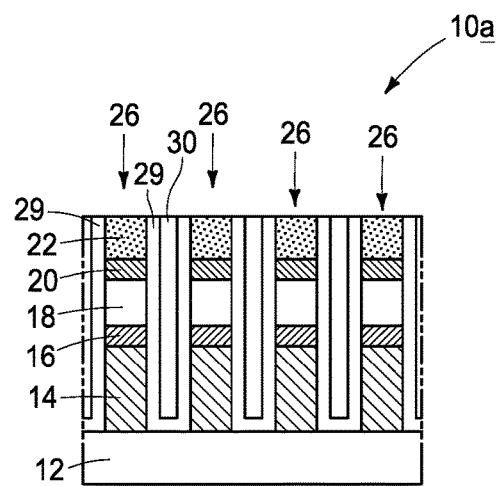
FIG. 37 is a diagrammatic sectional view taken through line 37-37 in FIG. 35.

Additional example embodiments are next described with reference to FIGS. 35-46 with respect to a substrate fragment 10a. Like numerals from the above-described embodiments have been used where appropriate, with some construction differences being indicated with the suffix "a" or with different numerals. FIGS. 35-37 show a processing sequence corresponding to that of FIGS. 9-11 having occurred relative to a structure as shown in FIGS. 9-11. However, lower material 24 (not shown in FIGS. 35-37)

may or may not have previously been used. If used, FIGS. 35-37 depict removal having occurred of all remaining of lower material 24 (not shown) from the array after the patterning to form first lines 26.

Figure 38:
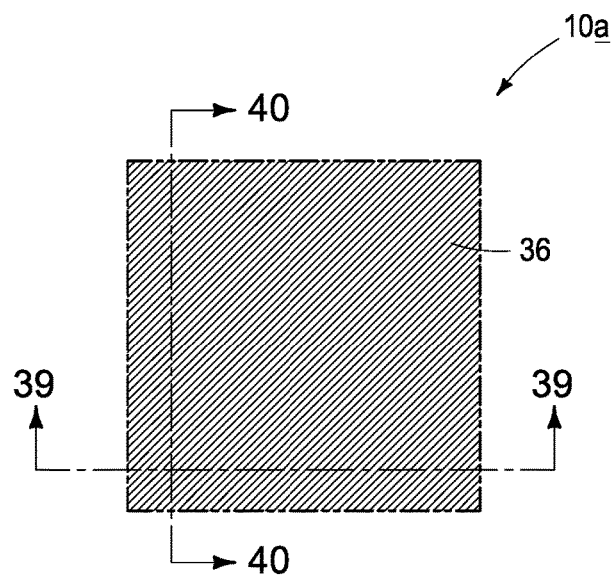
FIG. 38 is a view of the FIG. 35 substrate at a processing step subsequent to that shown by FIG. 35.
Figure 39:
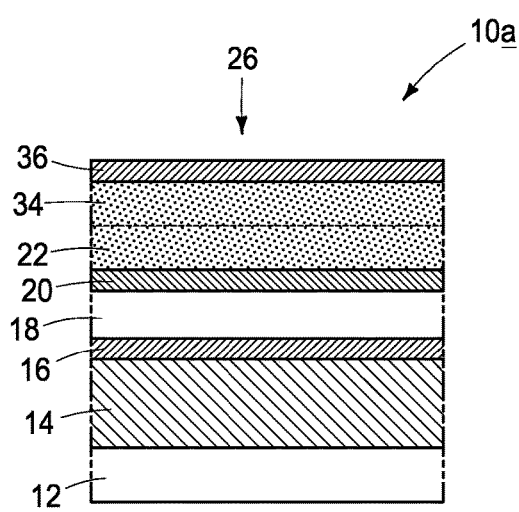
FIG. 39 is a diagrammatic sectional view taken through line 39-39 in FIG. 38.
Figure 40:
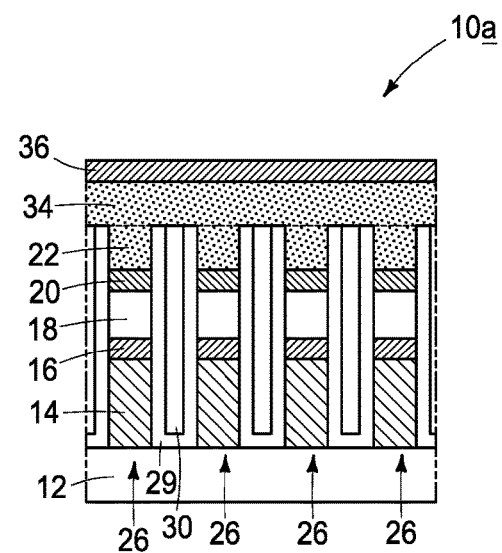
FIG. 40 is a diagrammatic sectional view taken through line 40-40 in FIG. 38.

Referring to FIGS. 38-40, outer multi-resistive state material 34 has been formed directly against inner multi-resistive state material 22 (e.g., no upper material 32 has been used). Accordingly, in one embodiment, such shows forming of the outer multi-resistive state material 34 directly against inner multi-resistive state material 22 of individual of first lines 26.

Figure 41:
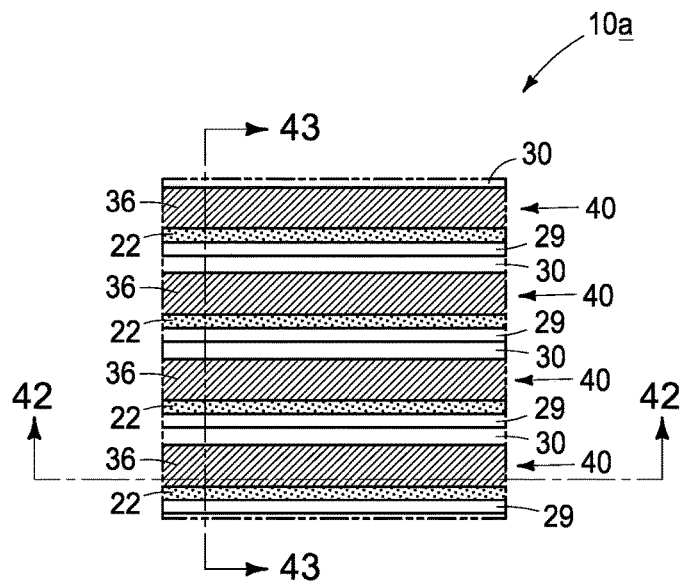
FIG. 41 is a view of the FIG. 38 substrate at a processing step subsequent to that shown by FIG. 38.
Figures 42, 43:
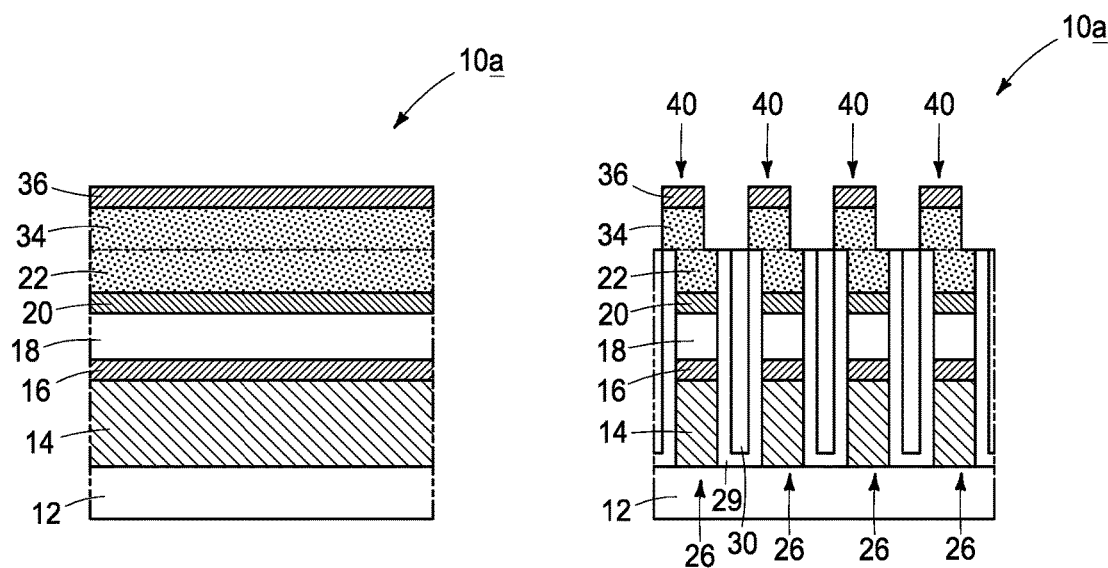
FIG. 42 is a diagrammatic sectional view taken through line 42-42 in FIG. 41.
FIG. 43 is a diagrammatic sectional view taken through line 43-43 in FIG. 41.
Figure 44:
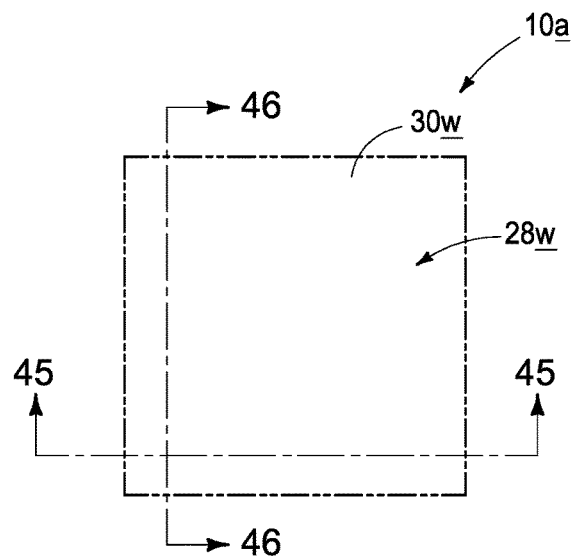
FIG. 44 is a view of the FIG. 41 substrate at a processing step subsequent to that shown by FIG. 41.
Figure 45:
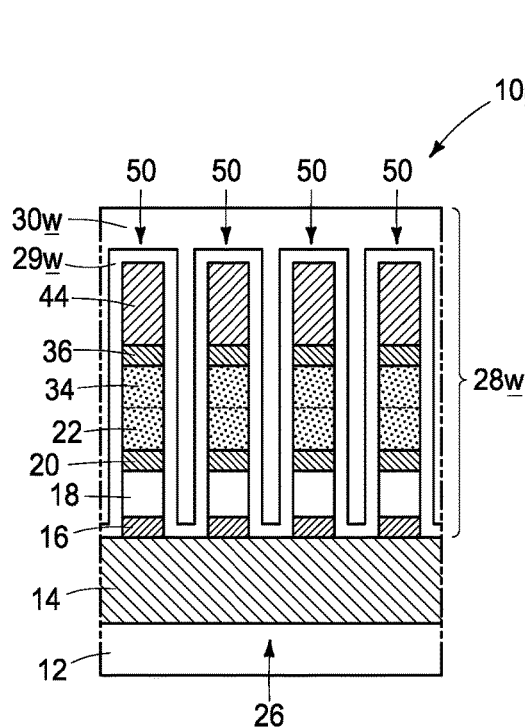
FIG. 45 is a diagrammatic sectional view taken through line 45-45 in FIG. 44.
Figure 46:
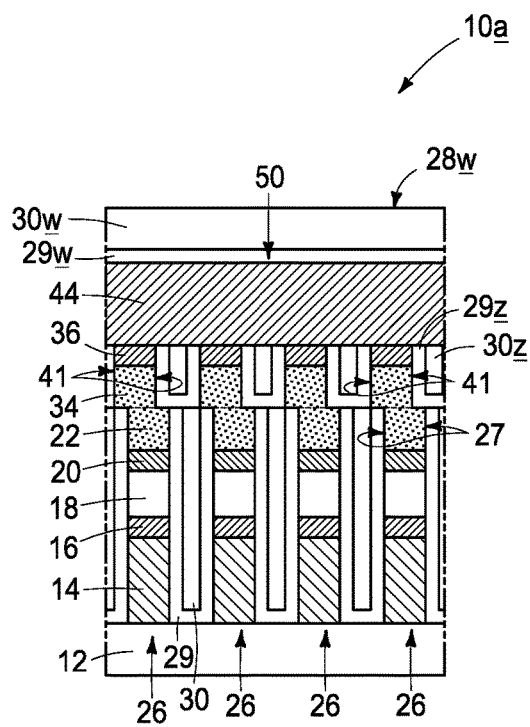
FIG. 46 is a diagrammatic sectional view taken through line 46-46 in FIG. 44.

Referring to FIGS. 41-43, spaced second lines 40 have been formed analogously to the processing depicted by FIGS. 15-17. Subsequent processing analogous to that disclosed in FIGS. 18-34 may occur whereby a construction as shown in FIGS. 44-46 results. Any other attribute(s) or construction(s) as described above may be used.

In one embodiment, sacrificial material is formed elevationally over the inner multi-resistive state material. The sacrificial material, the inner multi-resistive state material, and the inner electrode material are patterned to form the spaced first lines individually to comprise the sacrificial material, the inner multi-resistive state material, and the inner electrode material. All of the sacrificial material is removed before forming the elevationally outer multi-resistive state material. As one example, material 24 may be such sacrificial material. The sacrificial material in this embodiment may be any of metal material, semi-metal material, semiconductive, dielectric, ferroelectric etc. as its electrical properties are not relevant since it is all removed from being part of the spaced first lines.

Embodiments of the invention encompass an array of cross point memory cells independent of method of manufacture. Such an array comprises spaced elevationally inner first lines (e.g., row lines 26), spaced elevationally outer second lines (e.g., column lines 50) which cross the first lines, and a multi-resistive state region elevationally between the first and second lines where such cross. Individual of the multi-resistive state regions comprise elevationally outer multi-resistive state material (e.g., material 34) and inner multi-resistive state material (e.g., material 22) that are electrically coupled to one another. The inner and outer multi-resistive state materials may be of the same composition relative one another or of different compositions relative one another. Regardless, the inner and outer multi-resistive state materials may be directly against one another or may not be directly against one another.

The inner multi-resistive state material has opposing edges in a vertical cross section, for example opposing edges 27 shown in the vertical cross-sections depicted by FIGS. 34 and 46. The outer multi-resistive state material has opposing edges in the vertical cross-section that are laterally offset relative to the opposing edges of the inner multi-resistive state material in the vertical cross-section. Such is shown by way of example with respect to opposing edges 41 being offset relative to opposing edges 27 in each of embodiments of FIGS. 34 and 46. Individual of the memory cells may comprise a select device, for example encompassed by select device material 18 in FIGS. 34 and 46.

At least one of metal material and semi-metal material may be elevationally between the inner and outer multi-resistive state materials. In one embodiment where present, the at least one of metal material and semi-metal material may be intrinsically of higher conductivity than each of the inner and outer multi-resistive state materials when each is programmed to its highest conductivity state. Regardless, in one embodiment the array may include lower material and upper material, with each comprising at least one of metal material and semi-metal material elevationally between the inner and outer multi-resistive state materials, and with the lower and upper materials being of different compositions relative one another. In one embodiment, the outer multi-resistive state material is directly against the upper material, and the upper material is intrinsically of higher conductivity than each of the inner and outer multi-resistive state materials when each is programmed to its highest conductivity state.

Any other attribute(s) or construction(s) as described above with respect to method may be used in an array of cross point memory cells.

CONCLUSION

In some embodiments, a method of forming an array of cross point memory cells comprises forming elevationally inner multi-resistive state material elevationally over inner conductive electrode material. The inner multi-resistive state material and the inner electrode material are patterned to form spaced first lines individually comprising the inner multi-resistive state material elevationally over the inner electrode material. Elevationally outer multi-resistive state material is formed elevationally over and electrically coupled to the inner multi-resistive state material of the first lines. The outer multi-resistive state material is patterned to form spaced second lines that individually are elevationally over, longitudinally along, and electrically coupled to the inner multi-resistive state material of individual of the first lines. Spaced third lines comprising outer conductive electrode material are formed to cross elevationally over and electrically couple to the patterned outer multi-resistive state material.

In some embodiments, an array of cross point memory cells comprises spaced elevationally inner first lines, spaced elevationally outer second lines which cross the first lines, and a multi-resistive state region elevationally between the first and second lines where such cross. Individual of the multi-resistive state regions comprise elevationally outer multi-resistive state material and elevationally inner multi-resistive state material that are electrically coupled to one another. The inner multi-resistive state material has opposing edges in a vertical cross-section. The outer multi-resistive state material has opposing edges in the vertical cross-section that are laterally offset relative to the opposing edges of the inner multi-resistive state material in the vertical cross-section.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of cross point memory cells, comprising:
spaced lower first lines, spaced upper second lines which cross the first lines above the lower first lines, and a multi-resistive state region elevationally between the first and second lines where such cross, individual of the memory cells comprising individual of the lower first lines, individual of the upper second lines, and individual of the multi-resistive state regions elevationally there-between where the individual first and second lines cross;

the individual multi-resistive state regions in the individual memory cells comprising upper multi-resistive state material and lower multi-resistive state material below the upper multi-resistive state material, the upper multi-resistive state material and the lower multi-resistive state material being electrically coupled to one another within the individual memory cells, the lower multi-resistive state material having opposing edges in a vertical cross-section within the individual memory cells, the upper multi-resistive state material having opposing edges in the vertical cross-section within the individual memory cells that are laterally offset relative to the opposing edges of the lower multi-resistive state material in the vertical cross-section within the individual memory cells; and first and second different composition dielectric materials between immediately-laterally-adjacent lower multi-resistive state materials of immediately-laterally-adjacent memory cells.

2. The array of claim 1 wherein the lower and upper multi-resistive state materials are of the same composition relative one another.

3. The array of claim 1 wherein the lower and upper multi-resistive state materials are of different compositions relative one another.

4. The array of claim 1 wherein the lower and upper multi-resistive state materials are directly against one another.

5. The array of claim 1 wherein the lower and upper multi-resistive state materials are not directly against one another.

6. The array of claim 1 comprising at least one of metal material and semi-metal material elevationally between the lower and upper multi-resistive state materials.

7. The array of claim 1 comprising:
lower intervening material comprising at least one of metal material and semi-metal material elevationally between the lower and upper multi-resistive state materials; and
upper intervening material comprising at least one of metal material and semi-metal material elevationally between the lower and upper multi-resistive state materials and over the lower intervening material, the lower and upper intervening materials being of different compositions relative one another.

8. The array of claim 1 wherein the upper multi-resistive state material and the lower multi-resistive state material have different thicknesses.

9. The array of claim 1 wherein the upper multi-resistive state material and the lower multi-resistive state material have the same thickness.

10. The array of claim 1 wherein the lower and upper multi-resistive state materials are of the same composition relative one another, the lower and upper multi-resistive state materials not being directly against one another.

11. The array of claim 1 wherein the lower and upper multi-resistive state materials are of different compositions relative one another, the lower and upper multi-resistive state materials not being directly against one another.

12. The array of claim 1 wherein at least one of the first and the second different composition dielectric materials is directly against the immediately-laterally-adjacent lower multi-resistive state materials of the immediately-laterally-adjacent memory cells.

13. The array of claim 12 wherein one and only one of the first and the second different composition dielectric materials is directly against each of the immediately-laterally-adjacent lower multi-resistive state materials of the immediately-laterally-adjacent memory cells.

14. The array of claim 1 wherein the first and the second different composition dielectric materials differ chemically.

15. The array of claim 1 wherein the first and the second different composition dielectric materials differ physically.

16. An array of cross point memory cells, comprising:
spaced lower first lines, spaced upper second lines which cross the first lines above the lower first lines, and a multi-resistive state region elevationally between the first and second lines where such cross, individual of the memory cells comprising individual of the lower first lines, individual of the upper second lines, and individual of the multi-resistive state regions elevationally there-between where the individual first and second lines cross;

the individual multi-resistive state regions in the individual memory cells comprising upper multi-resistive state material and lower multi-resistive state material below the upper multi-resistive state material, the upper multi-resistive state material and the lower multi-resistive state material being electrically coupled to one another within the individual memory cells, the lower multi-resistive state material having opposing edges in a vertical cross-section within the individual memory cells, the upper multi-resistive state material having opposing edges in the vertical cross-section within the individual memory cells that are laterally offset relative to the opposing edges of the lower multi-resistive state material in the vertical cross-section within the individual memory cells; and first and second different composition dielectric materials between immediately-laterally-adjacent upper multi-resistive state materials of immediately-laterally-adjacent memory cells.

17. The array of claim 16 wherein at least one of the first and the second different composition dielectric materials is directly against the immediately-laterally-adjacent upper multi-resistive state materials of the immediately-laterally-adjacent memory cells.

18. The array of claim 17 wherein one and only one of the first and the second different composition dielectric materials is directly against each of the immediately-laterally-adjacent upper multi-resistive state materials of the immediately-laterally-adjacent memory cells.

19. An array of cross point memory cells, comprising:
spaced lower first lines, spaced upper second lines which cross the first lines above the lower first lines, and a multi-resistive state region elevationally between the first and second lines where such cross, individual of the memory cells comprising individual of the lower first lines, individual of the upper second lines, and individual of the multi-resistive state regions elevationally there-between where the individual first and second lines cross;

the individual multi-resistive state regions in the individual memory cells comprising upper multi-resistive state material and lower multi-resistive state material below the upper multi-resistive state material, the upper multi-resistive state material and the lower multi-resistive state material being electrically coupled to one another within the individual memory cells, the lower multi-resistive state material having opposing edges in a vertical cross-section within the individual memory cells, the upper multi-resistive state material having opposing edges in the vertical cross-section within the individual memory cells that are laterally offset relative to the opposing edges of the lower multi-resistive state material in the vertical cross-section within the individual memory cells;

lower dielectric material between immediately-laterally-adjacent lower multi-resistive state materials of immediately-laterally-adjacent memory cells; and upper dielectric material between immediately-laterally-adjacent upper multi-resistive state materials of the immediately-laterally-adjacent memory cells, the upper dielectric material comprising first and second different composition dielectric materials, one of the first and the second different composition dielectric materials being elevationally between the lower dielectric material and the other of the first and the second different composition dielectric materials.

20. An array of cross point memory cells, comprising:

spaced lower first lines, spaced upper second lines which cross the first lines above the lower first lines, and a multi-resistive state region elevationally between the first and second lines where such cross, individual of the memory cells comprising individual of the lower first lines, individual of the upper second lines, and individual of the multi-resistive state regions elevationally there-between where the individual first and second lines cross;

the individual multi-resistive state regions in the individual memory cells comprising upper multi-resistive state material and lower multi-resistive state material below the upper multi-resistive state material, the upper multi-resistive state material and the lower multi-resistive state material being electrically coupled to one another within the individual memory cells, the lower multi-resistive state material having opposing edges in a vertical cross-section within the individual memory cells, the upper multi-resistive state material having opposing edges in the vertical cross-section within the individual memory cells that are laterally offset relative to the opposing edges of the lower multi-resistive state material in the vertical cross-section within the individual memory cells;

first and second different composition dielectric materials between immediately-laterally-adjacent lower multi-resistive state materials of immediately-laterally-adjacent memory cells;

the first dielectric material and the second dielectric material between immediately-laterally-adjacent upper multi-resistive state materials of the immediately-laterally-adjacent memory cells; and one of the first and the second different composition dielectric materials between the immediately-laterally-adjacent upper multi-resistive state materials of the immediately-laterally-adjacent memory cells also being elevationally between the other of the first and the second different composition dielectric materials that is between the immediately-laterally-adjacent lower multi-resistive state materials of the immediately-laterally-adjacent memory cells.

\* \* \* \* \*